United States Patent [19]

Henderson et al.

[11] 4,106,059
[45] Aug. 8, 1978

[54] PHASE LOCKED LOOP TELEVISION TUNING SYSTEM

[75] Inventors: John Goodchilde Norie Henderson; Charles Martin Wine, both of Princeton, N.J.

[73] Assignee: RCA Corporation, New York, N.Y.

[21] Appl. No.: 779,126

[22] Filed: Mar. 18, 1977

Related U.S. Application Data

[63] Continuation-in-part of Ser. No. 718,455, Aug. 30, 1976, abandoned.

[51] Int. Cl.² .............................................. H04N 5/44
[52] U.S. Cl. ..................................................... 358/191
[58] Field of Search ................ 358/21, 166, 167, 188, 358/191–193, 195; 325/418–428, 464; 331/16, 18, 20, 25

[56] References Cited

U.S. PATENT DOCUMENTS

| | | | |
|---|---|---|---|
| 4,009,439 | 2/1977 | Rast | 325/421 |
| 4,024,476 | 5/1977 | Briggs | 325/421 |
| 4,025,953 | 5/1977 | Sideris | 358/191 |
| 4,031,549 | 6/1977 | Rast et al. | 358/193 |

Primary Examiner—John C. Martin
Assistant Examiner—Aristotelis M. Psitos
Attorney, Agent, or Firm—Eugene M. Whitacre; Peter M. Emanuel

[57] ABSTRACT

A phase locked loop tuning system for a television receiver includes a voltage controlled local oscillator for generating a local oscillator signal corresponding to the channel presently selected by a viewer, a source of a reference frequency signal, a phase detector for generating pulses at the reference frequency the duration of which is a function of the phase and frequency relationship between the reference frequency signal and the local oscillator signal, and a low pass filter for deriving a D.C. control voltage for the voltage controlled oscillator from the output signal of the phase detector. The reference frequency is related to the horizontal and vertical television scanning rates in a predetermined manner so that undesired image components generated in response to unfiltered pulse components of the control voltage occurring at the reference frequency are substantially cancelled as an image is formed.

12 Claims, 1 Drawing Figure

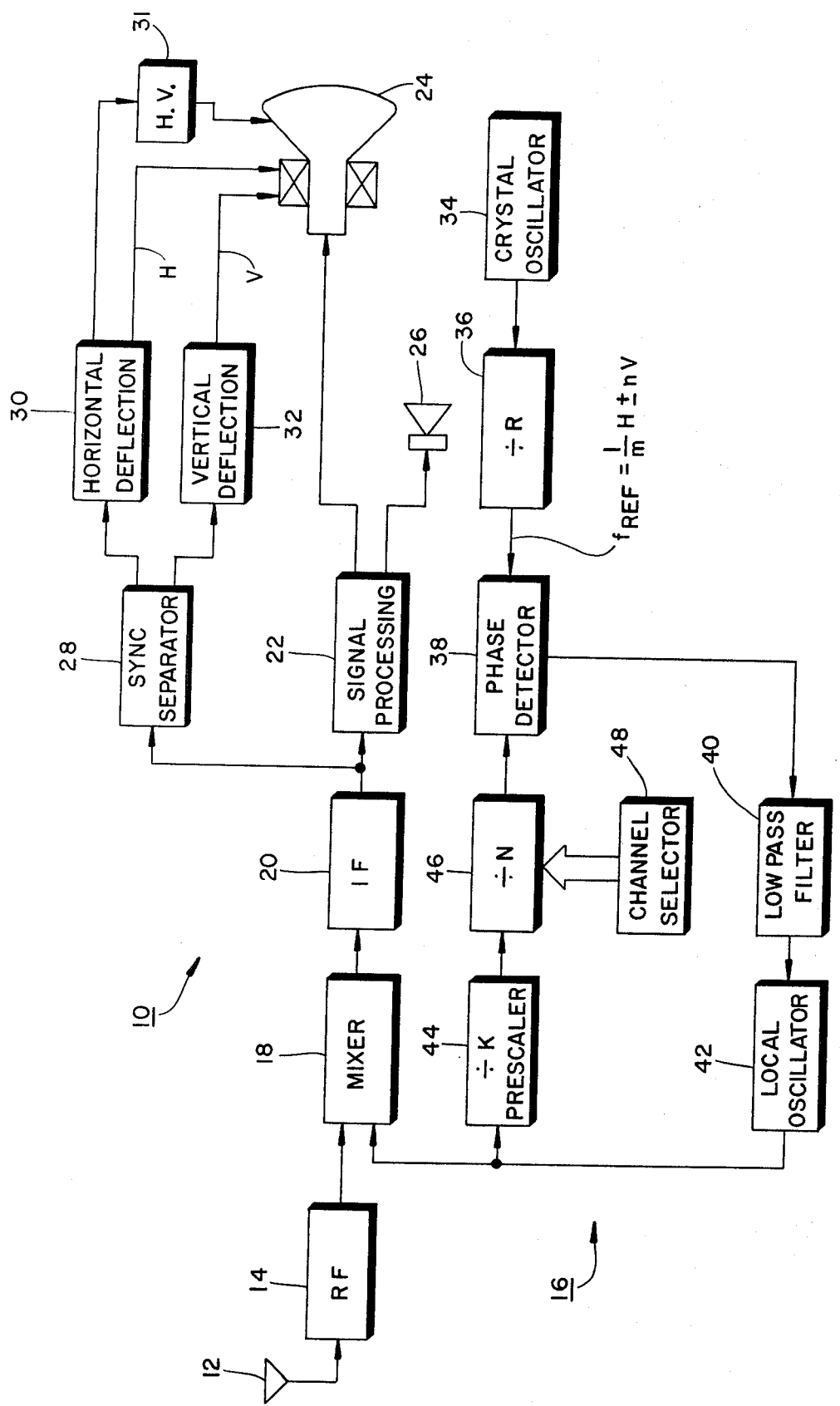

PHASE LOCKED LOOP TELEVISION TUNING SYSTEM

BACKGROUND OF THE INVENTION

This application is a continuation-in-part of Ser. No. 718,455 filed on Aug. 30, 1976 and now abandoned.

The present invention is directed to the field of electronic tuning systems for television receivers and is particularly directed to the field of phase locked loop tuning systems for television receivers.

Phase locked loops are desirably employed in many applications because they are capable of synthesizing a signal having a relatively accurate and stable frequency which may readily be controlled. Typically, phase locked loops include a source of a reference frequency signal, a controlled oscillator, a programmable counter to divide the frequency of the controlled oscillator output by a controllable factor, a phase detector to derive a signal representing the phase and frequency relationship between the reference frequency signal and the output signal of the controlled oscillator signal and a low pass filter to derive a D.C. control signal for the controlled oscillator from the output signal of the phase detector. Examples of such phase locked loops and their applications are described in RCA Digital Integrated Circuits, Application Note ICAN 6101 entitled, "The RCA COS/MOS Phase-Locked-Loop — A Versatile Building Block for Micro-Power Digital and Analog Applications", which may, for example, be found in the RCA 1974 Databook SSD-203B (COS/MOS Digital Integrated Circuits).

Because of the programming, accuracy and stability performance advantages of phase locked loops, they have recently been suggested for use in radio and television tuning systems. For example, phase locked loop types of television tuning systems are described in copending U.S. patent applications Ser. No. 632,060 filed in the name of J. G. N. Henderson on Nov. 14, 1975; Ser. No. 662,096 filed in the name of R. M. Rast on Feb. 27, 1976 and Ser. No. 688,521 filed in the name of R. M. Rast et al. on May 21, 1976 and now U.S. Pat. No. 4,031,549.

Care must be taken in selecting the components of a phase locked loop tuning system so as to insure its compatibility with the receiver in which it is utilized. For example, phase locked loop tuning systems generally utilize a phase detector of the type, such as is described for example, in the above-identified RCA Application Note, which generates pulses at the frequency of the reference frequency signal whose durations represent the phase and frequency relationship between the reference frequency signal and the local oscillator signal. Unfortunately, because the low pass filter utilized to derive the control signal for the controlled oscillator from the output signal of the phase detector may not sufficiently filter the output signal of the phase detector, pulses at the reference frequency may undesirably amplitude modulate the control signal. As a result, the local oscillator signal generated in response to the amplitude of the control signal may include a frequency modulated component which, when processed by the receiver, may give rise to undesirable interference signals in the receiver's audio or video output signals.

For example, frequency modulated components of local oscillator signals generated by a phase locked loop tuning system of a frequency modulation (FM) radio receiver may be demodulated by the receiver's demodulator to produce audible interference signals annoying to a listener. To reduce the generation of such audible interference signals in FM radio receivers utilizing a phase locked loop type of tuning system, the reference frequency of the phase locked loop may be selected to be higher than the highest frequency in the audio frequency range. In this manner, undesirable components at the reference frequency generated by the phase locked loop tuning system will be outside of the audio frequency range and therefore not be heard by the average listener.

However, a similar technique, whereby the reference frequency of a phase locked loop tuning system for a television receiver is selected to be higher than the frequency of the highest frequency signal utilized to produce an image to reduce the visible effects of frequency modulated components generated by the phase locked loop tuning system cannot be readily implemented since it would require the use of a reference frequency considerably higher (e.g., greater than 4.5 MHz) than that capable of being readily processed by the digital circuitry presently available for use in phase locked loops.

Furthermore, although it is desirable to share components of the phase locked loop tuning system with other portions of a television receiver in which it is employed to reduce the cost of the receiver, care must be taken that the reduced cost is not at the expense of the overall performance of the receiver. For example, it has been suggested in an article entitled, "A Frequency Synthesizer for Television Receivers", by Eric Breeze et al. published in the IEEE Transactions, November 1974, and U.S. Pat. No. 3,980,951 entitled, "Electronic Tuning Control System for Television", filed in the name of Eric Breeze et al. on Aug. 13, 1975 and issued on Sept. 14, 1976, to couple the signal 3.58 MHz (i.e., the color subcarrier frequency in the United States) derived by a crystal oscillator of a color demodulator of a television receiver to a phase detector employed in a phase locked loop for tuning the receiver to reduce the cost of the receiver by eliminating the cost of a separate crystal oscillator from which a reference frequency signal may be derived. However, under such circumstances it is advisable to divide the frequency of the 3.58 MHz signal sufficiently to provide a frequency compatible with the operating frequency range of digital circuitry employed in the phase locked loop. The factor by which the 3.58 MHz signal is divided should desirably also be selected to reduce the visible effects of modulated components of the local oscillator occurring at the reference frequency earlier described. Although the Breeze et al. article (on page 262) states that an additional advantage of using the 3.58 MHz color subcarrier signal as a reference is that any digital noise generated would be coherent with the 15.75 KHz raster frequency and would therefore be less objectionable when seen on the screen, for reasons later to be explained the reference frequencies derived by dividing the 3.58 MHz color subcarrier frequency by means of dividers which are capable of dividing the integer number would not be suitable for substantially cancelling interference images generated in response to unfiltered pulse components of the control signal of a phase locked loop tuning system occurring at the reference frequency in the manner set forth in detail below.

SUMMARY OF THE INVENTION

In accordance with the present invention, a phase locked loop tuning system employed to generate the local oscillator signal for a television receiver which produces an image by scanning an image reproducing device at predetermined scanning rates includes means for generating a reference signal having a frequency related to the predetermined scanning rates so that the visible effects of an unfiltered component of the local oscillator signal occurring at the reference frequency are substantially cancelled as an image is formed.

BRIEF DESCRIPTION OF THE DRAWINGS

The sole FIGURE shows, in block diagram form, a television receiver including a phase locked loop type of tuning system constructed in accordance with the present invention.

DETAILED DESCRIPTION OF THE PREFERRED EMBODIMENT

The television receiver of the sole FIGURE includes an antenna 12 for receiving radio frequency (RF) television signals and an RF processing unit 14 for amplifying and otherwise processing the received signals. The processed RF signals are combined in a mixer 18 with local oscillator signals generated by a phase locked loop tuning system 16 to form an intermediate frequency (IF) signal. The intermediate frequency signal is amplified, filtered and otherwise processed in an IF processing unit 20 and a signal processing unit 22 to provide chrominance, luminance, synchronization and sound signal components. The chrominance and luminance signals are coupled to appropriate electrodes of a kinescope 24 and the sound signals are coupled to a loudspeaker 26 by means of a signal processing unit 22.

The synchronization components of the signal provided by IF signal processing unit 20 are coupled to a synchronization signal (sync) separator which extracts horizontal and vertical synchronization pulses from the composite signal. The horizontal synchronization pulses are coupled to a horizontal deflection unit 30 which controls the horizontal deflection of the electron beams generated by kinescope 24. Horizontal deflection unit 30 also couples a signal to a high voltage unit which develops a supply voltage for kinescope 24 therefrom. Vertical synchronization pulses are coupled to a vertical deflection unit 32 which controls the vertical deflection of electron beams generated by kinescope 24.

Portions of the receiver thus far described may be formed in a manner similar to corresponding portions of the receiver disclosed in RCA Television Service Data, File 1975 C-10 for the CTC-74 chassis published by RCA Corporation, Indianapolis, Indiana.

Phase locked loop tuning system 16 includes an oscillator 34, which for example may comprise a crystal oscillator, for generating a signal having an accurate and stable fixed frequency $f_{XTAL}$. The frequency of the fixed frequency signal is divided by a factor R by means of a divider 36, which may, for example, comprise a counter, to develop a reference frequency signal having a frequency $f_{REF}$ equal to $f_{XTAL}/R$. The value of the factor R is selected so that the reference frequency $f_{REF}$ is suitably low to make it compatible with the operating frequency range of other portions of phase locked loop 16. Furthermore, as will be subsequently explained, the value of the factor R is selected in relation to the value of the fixed frequency $f_{XTAL}$ to produce a reference frequency, related in a predetermined manner to the receiver's horizontal and vertical electron beam scanning rates, H and V, respectively, to reduce the visible effects of undesirable frequency modulated components of the local oscillator signal which may be generated by phase locked loop 16.

The reference frequency signal is directly coupled (i.e., coupled without further frequency division) to an input of a phase detector 38. The output signal of a programmable divider 46 is coupled to the other input of phase detector 38. Phase detector 38 develops a signal representing the phase and/or frequency deviation between its two input signals. A typical phase detector suitable for use in phase locked loop 16 provides a series of pulses at the reference frequency whose duration is related to the phase and frequency deviation between its two input signals. Such a phase detector is described in the aforementioned RCA application note ICAN 6061, hereby incorporated by reference, and which is included in the CD4046 integrated circuit phase locked loop available from RCA Corporation, Somerville, N.J.

The output signal of phase detector 38 is coupled to a low pass filter 40 which integrates it to form a DC signal the amplitude of which varies in accordance with the phase and frequency deviations between the input signals of phase detector 38. This varying DC signal is coupled to a voltage controlled oscillator, serving as a local oscillator 42, to control its frequency of oscillation. The local oscillator output signal of oscillator 42 is coupled to a mixer 18 and to divide-by-K prescaler 44.

Divide-by-K prescaler 44 comprises, for example, a counter which divides the frequency of the local oscillator signal by a factor K selected so that its output signal has a frequency which is compatible with the operating frequency range of the remaining components of phase locked loop 16. Specifically, the value of the factor K is selected so that the signal coupled to programmable divider 46 has a frequency lower than the highest frequency which programmable divider is capable of processing.

Programmable divider 46 divides the frequency of the output signal of prescaler 44 by a programmable factor N dependent on the channel selected by a viewer by means of a channel selector unit 48. Programmable divider 46 may, for example, comprise a counter which counts N cycles of its input signal for each cycle of its output signals. The factor N is controlled, for example, in response to binary coded decimal (BCD) signals provided by channel selector unit 48. The output signal of programmable divider 46 is coupled to phase detector 38 to complete phase locked loop 16.

In operation, the control signal produced by low pass filter 40 controls the frequency of the local oscillator signal until the frequency and phase of the output signals of divide-by-R divider 36 and divide-by-N divider 46 are in a predetermined relationship, e.g., substantially equal. At this point, phase locked loop 16 is said to be "locked" and the local oscillator signal will have a frequency of $f_{LO}$ determined by the following expression:

$$f_{LO} = NK/R f_{XTAL} = NK f_{REF} \qquad (1)$$

In the U.S., the values, in MHz of the local oscillator frequencies for the channels a viewer may select include prime numbers (i.e., the lowest common divider is 1) in a range between 101 and 931. Therefore, it is desirable that, for each channel that may be selected by a viewer, N be equal to the frequency, in MHz, of the corresponding local oscillator signal. With this premise, expression (1) can be rewritten as:

$$1 \text{ MHz} = K f_{REF} \quad (2)$$

Theoretically, in accordance with expression (2), the frequency of the local oscillator is as stable as the reference frequency. Unfortunately, when a phase detector of the type described in RCA Application Note ICAN 6061, referenced above, is employed as phase detector 38, portions of the error pulses, representing the phase and frequency deviation between the output signals of divide-by-R divider 36 and divide-by-N divider 46, occurring at the reference frequency $f_{REF}$ may cause the local oscillator frequency $f_{LO}$ to be frequency modulated. This is so because in practice, low pass filter 40 cannot readily remove all traces of the error pulses from the D.C. control signal produced by it. As a result, the control signal applied to local oscillator 42 is amplitude modulated by error pulse components occurring at the reference frequency $f_{REF}$. The amplitude modulated components of the control signal tend to cause a corresponding frequency modulation of the local oscillator signal.

When a local oscillator signal containing frequency modulated components is combined with a radio frequency carrier in mixer 18, an intermediate frequency signal is produced which may also contain a frequency modulated component. Since conventional IF processing circuits which may be utilized as IF amplifier 20 have an asymmetric, e.g., decreasing, amplitude versus frequency response characteristic with respect to the picture carrier frequency, e.g., 45.75 MHz, IF signal components having a frequency higher than the picture carrier are attenuated more than IF signal components having a frequency lower than the picture carrier. Therefore, the video signal developed by IF processing unit 20 may include an amplitude modulated component at a frequency corresponding to the reference frequency. When processed by signal processing unit 22, these amplitude modulated components of the output signal IF processing unit 20 ordinarily may produce a visible interference pattern in the image reproduced by kinescope 24 which is annoying to a viewer.

As earlier mentioned, to reduce the visible effects of frequency modulated components of the local oscillator signal occurring at the reference frequency $f_{REF}$, the reference frequency is chosen in a predetermined relationship to the horizontal and vertical scanning rates, H and V, respectively. Specifically, reference frequencies which may be utilized for this purpose are defined by the expression:

$$f_{REF} = 1/m \text{ H} \pm n\text{V} \quad (3)$$

where $n$ is an integer and $m$ is an odd integer. In other words, this expression defines a family of frequencies all of which are the sum of an odd subharmonic of the horizontal scanning rate and a harmonic of the vertical scanning rate. Under these conditions, amplitude modulated components of the video signal corresponding to frequency modulated components of the local oscillator signal occurring at the reference frequency will tend to be cancelled as an image is formed.

Expression (3) will be better understood after a brief description of some aspects of the operation of receiver 10 to produce a color image. The image produced by receiver 10 is formed by scanning three substantially convergent intensity modulated electron beams corresponding to the three primary colors, i.e., red, green and blue, in a raster pattern across the phosphor coating on the inside face of kinescope 24. The electron beams are horizontally deflected along alternate horizontal lines while they are simultaneously vertically deflected. Two vertical transitions or fields are required to form a complete image. During one field the odd-numbered horizontal lines are scanned, while during the following field, the even-numbered horizontal lines are scanned. This type of raster scanning pattern is commonly referred to in the art as being interlaced because the horizontal lines skipped during one field are scanned during the next and vice versa. In the U.S. to form one complete image there are a total of 525 horizontal lines scanned at a rate H, equal to the frequency of the horizontal synchronization pulse, e.g., approximately 15.734 KHz. Since there are two fields scanned per image, the vertical scanning rate V, equal to the frequency of the vertical synchronization pulses is equal to H/525 = 2 or approximately 60 Hz.

In order to make the transmission and reception of color television signals compatible with the operation of monochrome ("black and white") television receivers, clusters of signals representing color information are interlaced in frequency with clusters of signals representing brightness (or luminance) information. As a result, the signals representing color information occupy the same frequency band as do the signals representing luminance information. So that color signals do not produce interference patterns on the screen of a monochrome receiver the carrier associated with the clusters of signals representing color information has a frequency which are odd harmonics of one-half the line scanning rate (H) while the carrier associated with the clusters of signals representing luminance information has a frequency which is whole multiple of the line scanning rate (H).

Because of these relationships to the horizontal scanning rate H, which in turn is related to the scanning rate V, brightness variations produced by a signal representing luminance information goes through a whole number of cycles during the scanning of any given line or frame. This means that either in the next line or in the next frame, the brightness variations reoccur in phase and a reinforcing effect is as a result produced. In the case of a signal representing color information, however, the opposite condition exists. Since the frequency of a signal representing color information is an odd harmonic of one-half the line frequency H, during the scanning time of any one line, a signal representing color information goes through a certain number of cycles plus a half-cycle. Thus, during the scanning of the next line in the same frame, the signal representing color information reoccurs out of phase by 180°. It also reoccurs out of phase during the scanning of the same line in the succeeding frame. As a result, a cancellation effect occurs as a result of this out of phase condition, and an interference pattern due to brightness variations produced on the screen of a monochrome receiver by a signal representing color information cannot readily be perceived by the human eye. Thus, satisfactory monochrome reproduction can be achieved when a composite color signal is being transmitted.

In the U.S. the carrier signal of the color information, i.e., the color subcarrier, has a frequency of 3.5795 . . . . MHz (approximately 3.58 MHz). The color subcarrier frequency, i.e., 3.5795 .... MHz, is equal to 455 times one-half of the horizontal line rate in the U.S., i.e., 15,734.26573 .... Hz (approximately 15,734 Hz). Therefore, interference image components resulting from the color subcarrier occur may times during each horizontal line. As discussed above, interference image components resulting from the color subcarrier are cancelled on a line by line basis. That is, the image interference signals resulting from the color subcarrier on one horizontal line are cancelled by out of phase image components resulting from the color subcarrier in the next (in numerical order) line which occurs in the next field. For example, color subcarrier image components in line 1 of field 1 are cancelled by out of phase color subcarrier image components in line 3 of field 1.

To understand expression (3), it is necessary to appreciate that the reference frequency $f_{REF}$ for phase locked loop television tuning systems is limited in frequency by the highest frequency which the components, specifically programmable dividers such as 46, of the phase locked loop are capable of processing. For state-of-the-art components which may be employed in phase locked loop systems, the reference frequency should desirably be considerably less than 3.58 MHz. Under these conditions, the periods of interference images related to the reference frequency signal have periods which are so long that several horizontal lines are scanned during them. In other words, while interference images related to the color subcarrier signal would tend to produce disconcerting patterns along the horizontal direction of an image if not cancelled, interference images related to the reference frequency signal would tend to produce disconcerting patterns along the vertical direction of an image if not cancelled.

As a result, in order to minimize the visibility of interference patterns related to a reference frequency signal which is compatible with state-of-the-art components for use in phase locked loop tuning systems, interference images related to a reference frequency signal should be cancelled on a field to field basis rather than on a line to line basis as is the case for interference images related to the color subcarrier. This means that interference images related to the reference frequency signal in one field should be out of phase with interference images related to the reference frequency signal in the next field. This may be expressed mathematically by the expression:

$$f_{REF} = jV \pm \tfrac{1}{2}V \quad (4)$$

where $j$ is any integer. The term $\tfrac{1}{2}V$ corresponds to the necessary phase reversal to accomplish cancellation of vertical patterns.

Recognizing that the integer $j$ can always be expressed as the sum or difference of two other integers $n$ and $p$, expression (4) can be rewritten as:

$$f_{REF} = (p \pm n)V \pm \tfrac{1}{2}V = \pm nV + (p \pm \tfrac{1}{2})V \quad (5)$$

Recalling that in the U.S. $V = 2H/525$, expression (5) may be rewritten as:

$$f_{REF} = \pm nV + (p \pm \tfrac{1}{2})2H/525 = \pm nV + (2p + 1)H/525 \quad (6)$$

Letting $$(2p \pm 1)/525 = 1/m \quad (7)$$

where $m$ is an integer, expression (6) can be written as $$f_{REF} = \pm nV + H/m \quad (8)$$

which is the same as expression (3). Referring to expression (7), it is seen that $$(2p \pm 1) = 525/m \quad (9)$$

Since $(2p \pm 1)$ always defines an odd integer, $m$ must be an integer factor of 525. Thus $m$ must be one of the odd numbers 1, 3, 5, 7, 15, 21, 25, 35, 75, 105, 175 or 525.

The values of $m$, $n$ and K which satisfy expression (3) are defined by the expression:

$$1\text{MHz} = K(1/m\,H \pm nV) \quad (10)$$

which is obtained by combining expressions (2) and (3). Furthermore, again recognizing that $V = H/525 \times 2$, expression (10) may be rewritten as:

$$1\text{MHz} = KH(1/m \pm 2n/525) \quad (11)$$

It is desirable that K be an integer number since dividers which divide by fractional divisors are relatively complex and therefore relatively expensive. Unfortunately, there are no exact solutions of expression (11) for which K is an integer number. However, there are many solutions for which K is an integer number and which provide a reference frequency within ±1 Hz of an exact frequency solution. Although a total cancellation of interference signals due to a frequency modulation of the local oscillator signal occurring at the reference frequency rate cannot be achieved by such a non-exact solution, a significant reduction, e.g., between 15 and 20 decibels (dB), of the interference signal can be expected.

One non-exact solution of expression (11) which affords a significant reduction of the undesired interference signal is provided by the selection of $m$ equal to 5, $n$ equal to 17 and K equal to 240. With this solution, by utilizing a 1 MHz crystal oscillator and selecting R equal to K, a reference frequency of 4166.66667 Hz having a deviation of 0.8325 Hz from the corresponding exact frequency solution defined by expression (11) is provided. This solution is a particularly desirable one for the following reasons. Counters which are utilized to divide the frequency of relatively high frequency signals, e.g., such as the local oscillator signal for channel 82 having a frequency of 931 MHz in the United States, desirably include as large a number as possible of binary (flip-flop) stages cascaded without a feedback path from the output of one stage to the input of a second stage whereby the second stage is reset after a predetermined count. This is so because resetting a binary stage requires a time delay which considerably limits the maximum frequency of operation of a counter. Selecting K as 240 permits utilizing a counter comprising 4 binary stages cascaded without a feedback path to divide by 16 followed by 4 binary stages with a feedback path to divide by 15. Since the first four stages of the counter do not utilize a feedback path they can readily divide the relatively high input frequency (by 16) to provide a relatively low frequency which can be further divided (by 15) by the last four stages (the frequency of operation of which is limited by the feedback path).

Examples of other solutions which permit the use of at least 2 binary (flip-flop) cascaded without a feedback path are now set forth. These solutions may be implemented to form a phase locked loop tuning system by utilizing a 1 MHz crystal oscillator and by selecting R equal to K. Selecting m equal to 5, n equal to −5 and K equal to 344 provides a reference frequency of 2906.97674 Hz having a 0.11616 Hz deviation from the corresponding exact reference frequency. A counter which may be utilized to divide by 344 may comprise, for example, 3 binary stages cascaded without a feedback path to divide by 8 followed by 6 binary stages cascaded with a feedback path to divide by 43. Selecting m equal to 5, n equal to −1 and K equal to 324 provides a reference frequency of 3086.41975 Hz having a deviation of 0.4933 Hz from the exact reference frequency defined by expression (5). A counter which may be utilized to divide by 324 may comprise, for example, 2 binary stages cascaded without a feedback path to divide by 4 followed by 7 binary stages cascaded with a feedback path to divide by 81.

With respect to the above-cited Breeze et al. article and patent where it is suggested to derive the reference frequency of a phase locked loop tuning system from the 3.58 MHz color subcarrier frequency, it is noted that there is no integer divider which may be used to convert the color subcarrier frequency to an odd submultiple of the horizontal line scanning rate H as required by expression (3). As earlier explained, in the United States so that color subcarrier frequency components are not visible in an image, the color subcarrier frequency was deliberately chosen so that it is an odd harmonic of one-half the horizontal line scanning rates. In other words, 3.57954 . . . . MHz divided by 15,734.26573 . . . . Hz equals 222.5 which is not an integer number. Specifically, in the Breeze et al. article, two reference frequencies are derived from the 3.58 MHz color subcarrier frequency: a 10 KHz reference frequency for VHF channels is derived by dividing 3.58 MHz by 358 (i.e., 179 × 2) and a 2.5 KHz reference frequency for UHF channels is derived by dividing 3.58 MHz by 1432 (179 × 8). Applying the relationship of expression (3) to find a null reference frequency which will substantially cancel video components related to the reference frequency signal close to the 10 KHz VHF reference frequency of the Breeze et al. article, we find that a null reference frequency is 9.98001982 KHz [see expression (3) with $m = 3$ and $n = 79$]. Thus, the Breeze et al. reference frequency for VHF channels is approximately 19 Hz away from the null reference frequency defined in expression (3). Similarly, it can be shown that the 2.5 KHz UHF reference frequency of the Breeze et al. article is approximately 12 Hz away from the closest null frequency defined in expression (3) [see expression (3) with $m = 7$ and $n = 4$]. Considering that the null reference frequencies according to the invention occur only 59.95 Hz (i.e., the vertical scanning frequency in the U.S.) apart, the reference frequencies derived from the color subcarrier frequency set forth in the Breeze et al. article are rather poor choices to substantially cancel video components generated in response to amplitude modulated components of a phase locked loop control signal occurring at the reference frequency.

By utilizing a phase locked loop tuning system wherein the reference frequency is substantially equal to one of the frequencies defined by expression (3), not only are undesired interference patterns, which may result from a frequency modulated component of the local oscillator signal occurring at the reference frequency, reduced, but they are reduced without additional circuitry. Indeed, circuitry employed in the phase locked loop tuning system may actually be simplified. For example, since the reduction of the undesirable effects of frequency modulated components occurring at the reference frequency will be no longer solely dependent on the low pass filter included in the loop, its filtering requirements may be relaxed. As a result, a less complex and therefore less expensive low pass filter may be utilized. Moreover, the acquisition or pull-in time of a phase locked loop (i.e., the time required for a phase locked loop to reach a locked condition), wherein the reference frequency substantially equal to one of the frequencies defined by expression (3) is provided, may be shorter than that of a conventional phase locked loop. This is so because the low pass filter employed in a phase locked loop wherein a reference frequency substantially equal to one of the frequencies defined by expression (3) is provided may utilize a low pass filter having a higher cutoff frequency than that of a low pass filter of a conventional phase locked loop having a cut-off frequency which is chosen sufficiently low to provide acceptable high frequency rejection.

What is claimed is:

1. A tuning system for a television receiver including an image reproducing means and means for scanning said image reproducing means along lines in a predetermined direction at a first rate H, a predetermined number L of said lines being scanned to form a field, two sequential fields being scanned at a second rate V/2, comprising:

controlled oscillator means for generating a local oscillator signal for tuning said television receiver to a selected channel in response to the amplitude of a control signal;

means for generating a reference frequency signal; and means coupled to said reference frequency generating means and coupled to said controlled oscillator means for generating said control signal, said control signal representing the phase and frequency relationship between said local oscillator signal and said reference frequency signal, said control signal having amplitude components occurring at said reference frequency;

said reference frequency signal having a frequency related to said scanning rates in a predetermined manner so that visible effects of video components generated in response to said amplitude modulated components of said control signal are substantially cancelled on a field to field basis as said image reproducing means is scanned;

said frequency of said reference frequency signal being less than or equal to the highest frequency said means for generating said control signal is capable of processing.

2. The tuning system recited in claim 1 wherein said reference frequency is substantially equal to $$jV \pm \tfrac{1}{2}V$$

where $j$ is an integer.

3. The tuning system recited in claim 1 wherein said reference frequency is substantially equal to $$1/mH \pm nV$$

where $m$ is an integral factor of L and $n$ is an integer.

4. The tuning system recited in claim 3 wherein said predetermined direction is substantially horizontal.

5. The tuning system recited in claim 4 wherein said means for generating said control signal comprises means for generating a series of pulses at said reference frequency having a characteristic related to the phase and frequency relationship between said local oscillator signal and said reference frequency signal.

6. The tuning system recited in claim 5 wherein said means for generating said control signal comprises means for integrating said series of pulses.

7. The tuning system recited in claim 6 wherein said means for generating a reference frequency signal comprises a source of fixed frequency signal and means for dividing said fixed frequency by a factor R.

8. The tuning system recited in claim 7 wherein said local oscillator signal is coupled to means for dividing the frequency of said local oscillator signal by a prescaling factor K to generate a prescaled local oscillator signal; and said prescaled local oscillator signal is coupled to said means for generating said control signal through means for dividing the frequency of said prescaled local oscillator signal by a factor N related to said selected channel.

9. The tuning system recited in claim 8 wherein K is equal to R.

10. The tuning system recited in claim 9 wherein said means for dividing the frequency of said prescaled local oscillator signal by said factor N comprises a programmable counter; and said factor K is selected so that the frequency of said prescaled local oscillator signal is lower than or equal to the highest frequency said programmable counter is capable of processing.

11. The tuning system recited in claim 10 wherein K is an integer.

12. The tuning system recited in claim 11 wherein said means for dividing the frequency of said fixed frequency signal by said factor R comprises a first counter; said means for dividing the frequency of said local oscillator signal by said factor K comprises a second counter; and said factors K and R are equal to 240.

* * * * *

UNITED STATES PATENT AND TRADEMARK OFFICE
CERTIFICATE OF CORRECTION

PATENT NO. : 4,106,059

DATED : August 8, 1978

INVENTOR(S): John Goodchilde Norie Henderson, et al.

It is certified that error appears in the above-identified patent and that said Letters Patent is hereby corrected as shown below:

Column 4, line 63 (equation 1), that portion reading

"$f_{LO} = NK/Rf_{XTAL} = NKf_{REF}$" should read

-- $f_{LO} = \frac{NK}{R} f_{XTAL} = NKf_{REF}$ --

Column 6, line 20, that portion reading "H/525 = 2" should read -- $\frac{H}{525} \times 2$ --;

Column 7, lines 63 and 64 (equation 6), that portion reading

"$f_{REF} = \pm nV + (p \pm \frac{1}{2})2H/525 = \pm nV + (2p + 1) H/525$" should read -- $f_{REF} = \pm nV + (p \pm \frac{1}{2}) \frac{2H}{525} = \pm nV + (2p \pm 1) \frac{H}{525}$ --.

Signed and Sealed this

Thirteenth Day of February 1979

[SEAL]

Attest:

RUTH C. MASON
*Attesting Officer*

DONALD W. BANNER
*Commissioner of Patents and Trademarks*